United States Patent
Lin

(10) Patent No.: US 7,231,565 B2
(45) Date of Patent: Jun. 12, 2007

(54) METHOD FOR PERFORMING BUILT-IN AND AT-SPEED TEST IN SYSTEM-ON-CHIP

(75) Inventor: Chih-Wen Lin, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 190 days.

(21) Appl. No.: 11/160,974

(22) Filed: Jul. 18, 2005

(65) Prior Publication Data
US 2007/0016833 A1    Jan. 18, 2007

(51) Int. Cl.
*G01R 31/28* (2006.01)
*G06F 17/50* (2006.01)

(52) U.S. Cl. .......................................... 714/724; 716/4

(58) Field of Classification Search .................. None
See application file for complete search history.

(56) References Cited

U.S. PATENT DOCUMENTS

| | | | | |
|---|---|---|---|---|
| 5,257,268 A | * | 10/1993 | Agrawal et al. | 714/738 |
| 7,036,062 B2 | * | 4/2006 | Morris et al. | 714/733 |
| 2005/0154552 A1 | * | 7/2005 | Stroud et al. | 702/120 |

* cited by examiner

*Primary Examiner*—Christine T. Tu
(74) *Attorney, Agent, or Firm*—Winston Hsu

(57) ABSTRACT

A method for performing a built-in and at-speed test in a system-on-chip includes receiving a statistic timing analysis report of the system-on-chip, determining a plurality of critical paths for an at-speed test in the system-on-chip according to the statistic timing analysis report, analyzing signals at observe control points and capture control points of each of the critical paths for generating a plurality of test states, and transmitting the test states to a virtual instrumentation software architecture wrapper.

13 Claims, 5 Drawing Sheets

METHOD FOR PERFORMING BUILT-IN AND AT-SPEED TEST IN SYSTEM-ON-CHIP

BACKGROUND OF THE INVENTION

1. Field of the Invention

The present invention relates to a method for performing a built-in and at-speed test in a system-on-chip, and more particularly, a method for implementing a built-in and at-speed self-test including tests of critical paths in the system-on-chip.

2. Description of the Prior Art

Integrated circuits have been developed greatly, so the density of an integrated circuit has become higher. A system-on-chip, or SOC, integrating a complicated system into an independent chip, is superior to a system-on-PCB in weight, volume, performance, price, etc. However, a generative duration of a circuit test is proportional to the cube of a scale of the circuit. If a designer of a SOC ignores test issues of the SOC before completing the design, the cost of testing the SOC may be beyond the cost of manufacturing the SOC in mass production. Therefore, test issues are challenges in the development of SOCs.

Generally, a chip test is run by controlling and observing signals in circuits of a chip to determine whether the chip works well or not. In order to run a controllable and observable test, one of the DFT (design for testability) technologies in common use is used as a scan method. The scan method connects memory units in the chip, such as flip-flops, latches, etc., into a scan chain, so contents in the memory units are accessed through shifts in the scan chain. When performing a test, test patterns are shifted into the scan chain, and test results are shifted out from the scan chain. The test patterns are a set of logic values, and errors, if any, will be detected when the test results are different from ideal values. Traditionally, the chip test uses a single stuck-at fault (SSF) model, which models a defective circuit node as a stuck-at-one fault or a stuck-at-zero fault, meaning that signals in the node are locked in logic 0 (SA0) or logic 1 (SA1). Furthermore, tests for chips of deep sub-micron procedures must include various real-time or at-speed fault models, such as a transition fault model, a path delay fault model, etc.

The transition fault model includes a slow-to-rise model and a slow-to-fall model. Take the slow-to-rise model shown in FIG. 1 for example. An observing window is an acceptable delay time of a transition. If an expected output of a node cannot be captured in the observing window when performing a test, the node is considered to have a transition fault.

The path delay fault model is similar to the transition fault model except that the path delay fault model tests a total delay of a path in a chip. Please refer to FIG. 2, which illustrates a schematic diagram of a path delay fault model. In the path delay fault model, each test is aimed at a timing path in circuits. The test launches events or give values into an input of the timing path, and gathers or captures expected outputs from an output of the time path during an observing window.

In the prior art, the transition fault model can be generated by a scan chain, but a fault coverage of the transition fault model does not include tests of critical paths. The fault coverage means a ratio of detected faults to all possible faults, while the critical paths means paths having a delay duration greater than an expected duration. Therefore, to complete the tests of critical paths, the prior art must consume extra resources.

SUMMARY OF THE INVENTION

It is therefore a primary objective of the claimed invention to provide a method for performing a built-in and at-speed test in a system-on-chip.

The present invention discloses a method for performing a built-in and at-speed test in a system-on-chip. The method receives a statistic timing analysis report of the system-on-chip, determines a plurality of critical paths for an at-speed test in the system-on-chip according to the statistic timing analysis report, analyzes signals at observe control points and capture control points of each of the critical paths for generating a plurality of test states, and transmits the test states to a virtual instrumentation software architecture wrapper.

The present invention further discloses a method for performing a built-in and at-speed test in a system-on-chip. The method determines a plurality of critical paths for an at-speed test in the system-on-chip, determines observe control points and capture control points of each of the critical paths, and analyzes the system-on-chip according to signals of the observe control points and the capture control points.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
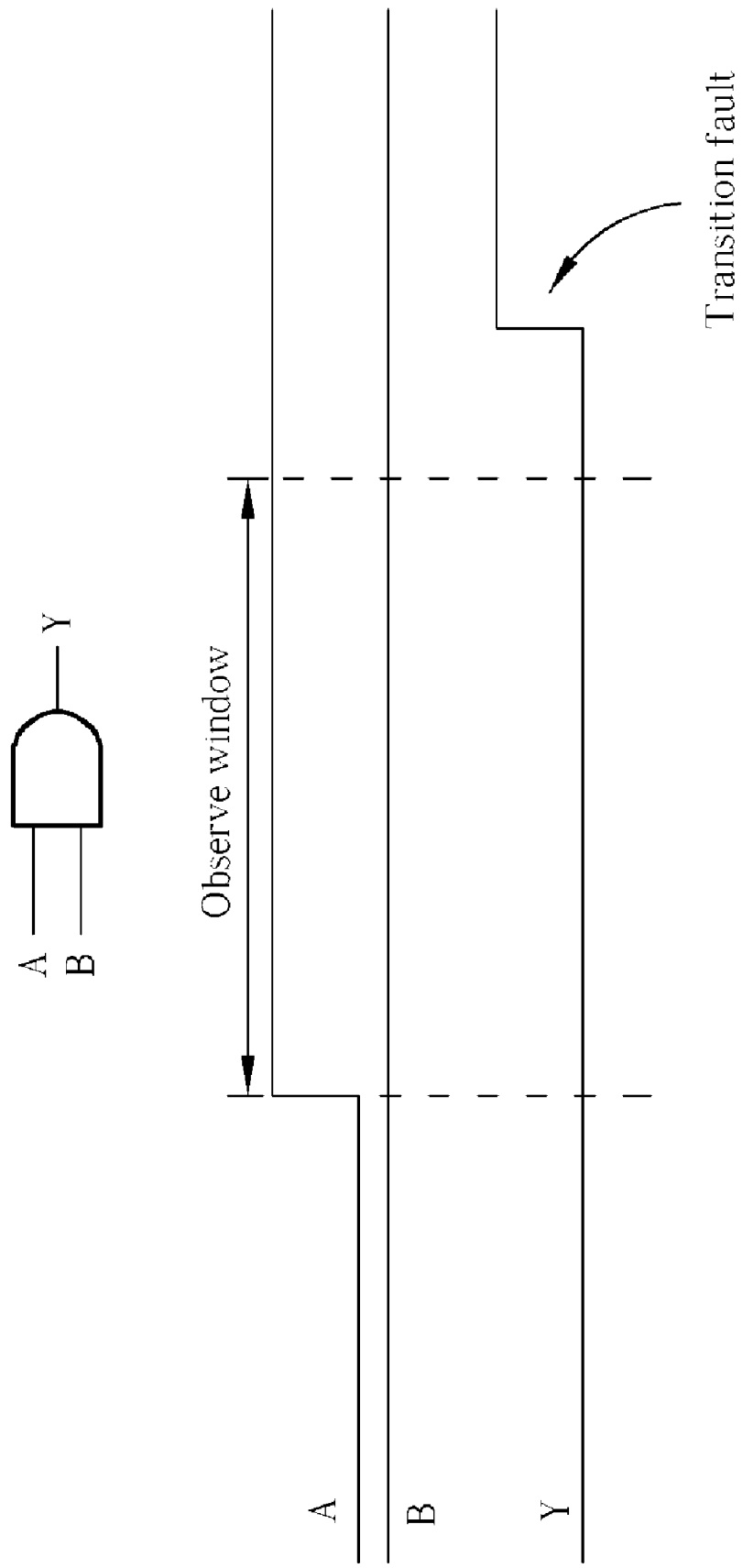
FIG. 1 illustrates a schematic diagram of a slow-to-rise model.
Figure 2:
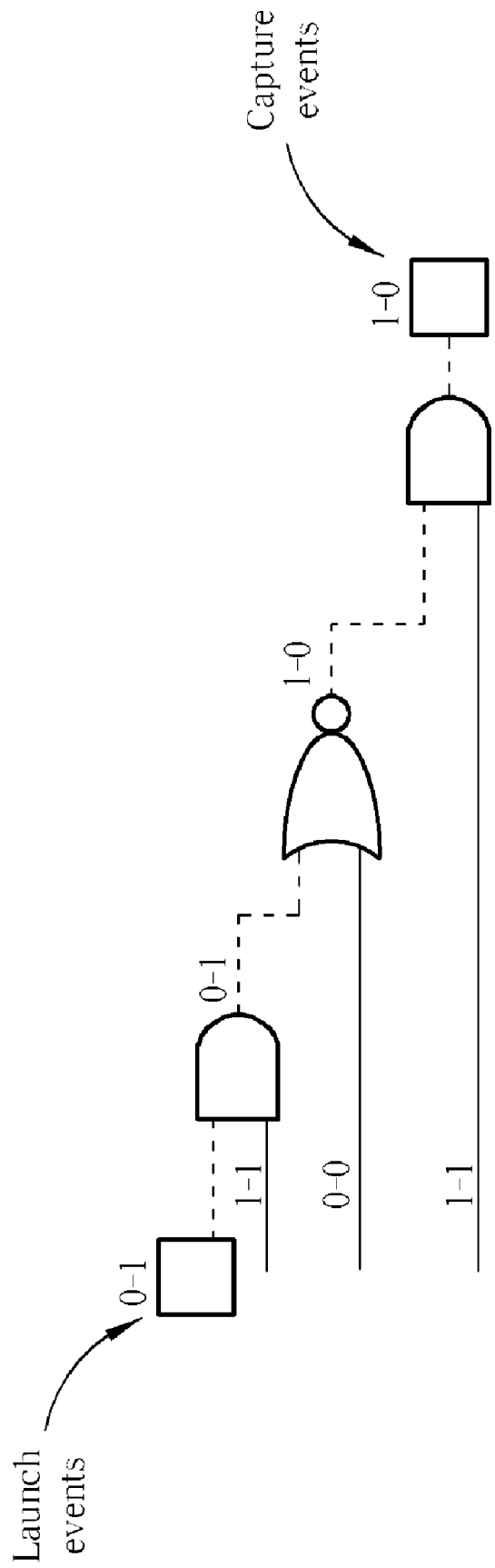
FIG. 2 illustrates a schematic diagram of a path delay fault model.
Figure 3:
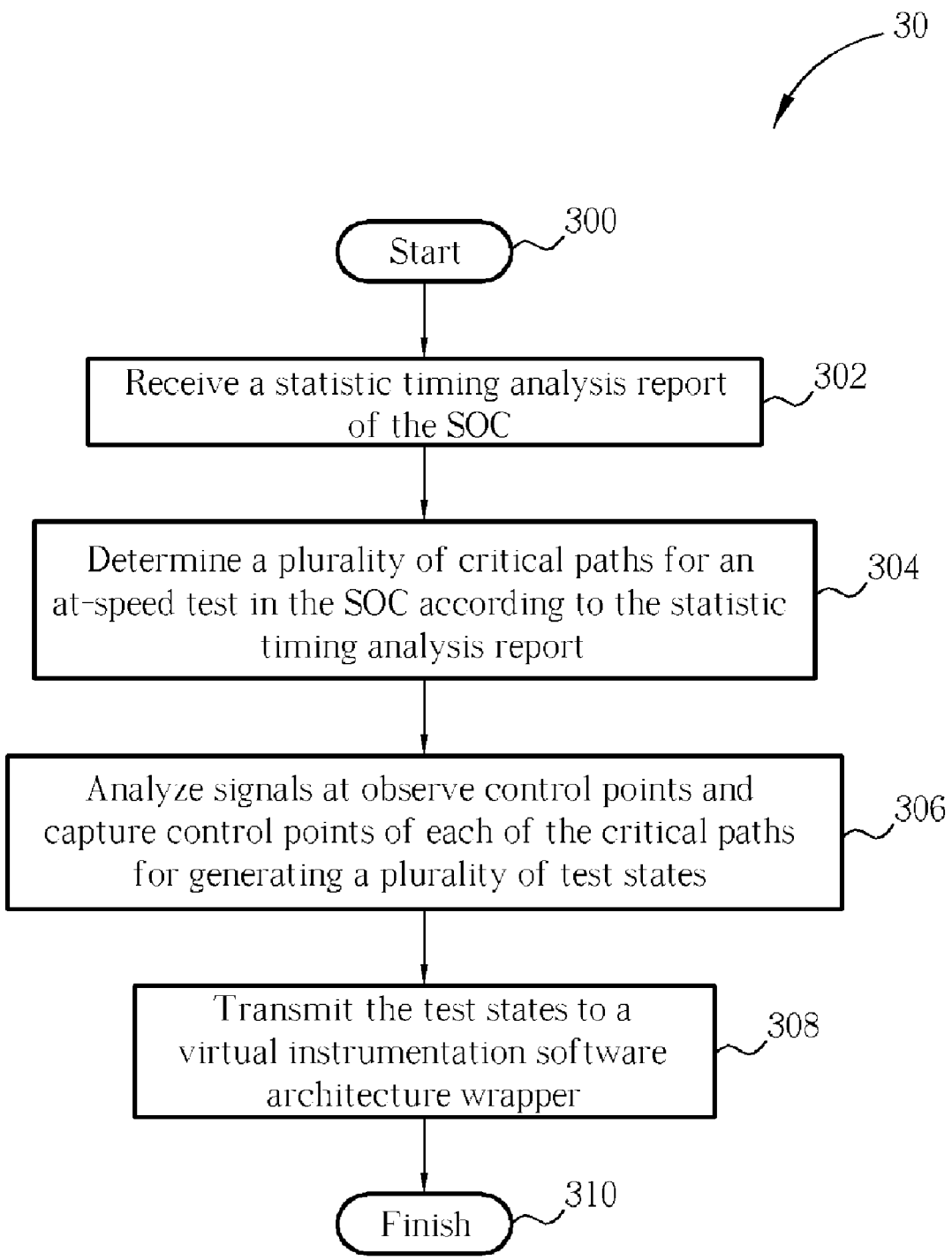
FIG. 3 illustrates a flowchart of a process for performing a built-in at-speed test in a SOC in accordance with present invention.

Please refer to FIG. 3, which illustrates a flowchart of a process 30 for performing a built-in at-speed test in a SOC in accordance with the present invention. The process 30 includes following steps:

Step 300: start.

Step 302: receive a statistic timing analysis report of the SOC.

Step 304: determine a plurality of critical paths for an at-speed test in the SOC according to the statistic timing analysis report.

Step 306: analyze signals at observe control points and capture control points of each of the critical paths for generating a plurality of test states.

Step 308: transmit the test states to a virtual instrumentation software architecture wrapper.

Step 310: finish.

Moreover, when performing a SOC test, the present invention can describe circuits of the SOC according to a timing diagram including circuit nodes and weighted edges, so as to get a statistic timing analysis report of the SOC. Then, according to the statistic timing analysis report, the present invention determines critical paths for an at-speed test in the SOC. Next, the present invention starts a prepare stage at a first time point for indicating a beginning of the at-speed test, and starts a launch stage at a second time point for outputting test signals, then starts a capture stage at a third time point for receiving the test signals. Therefore, the present invention can analyze signals at observe control points and capture control points of each of the critical paths for generating a plurality of test states, and transmit the test states to a virtual instrumentation software architecture wrapper through a test access port controller of the virtual instrumentation software architecture for analyzing the circuit.

Figure 4:
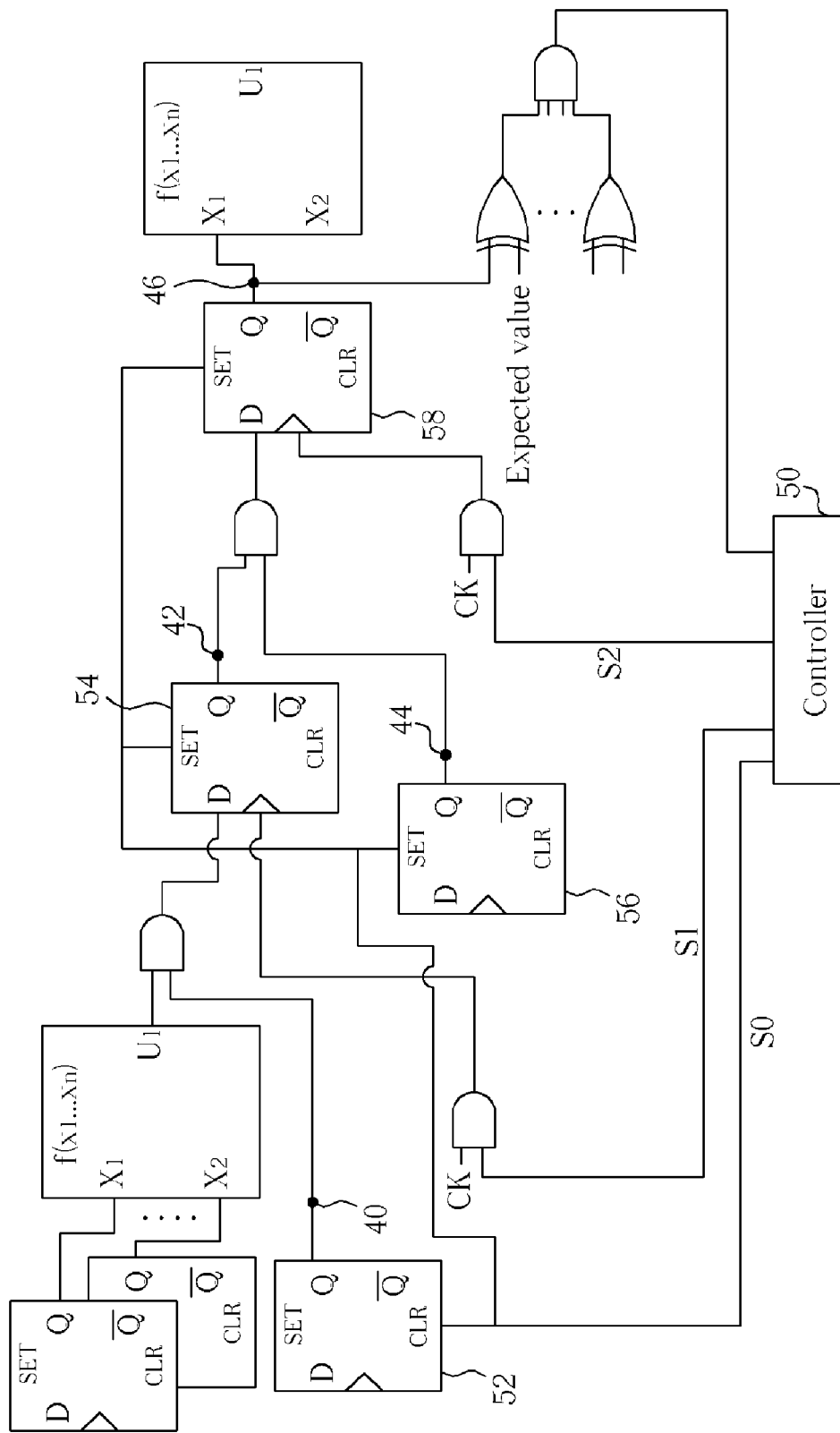
FIG. 4 illustrates a schematic diagram of a circuit when performing a test in accordance with the process shown in FIG. 3
Figure 5:
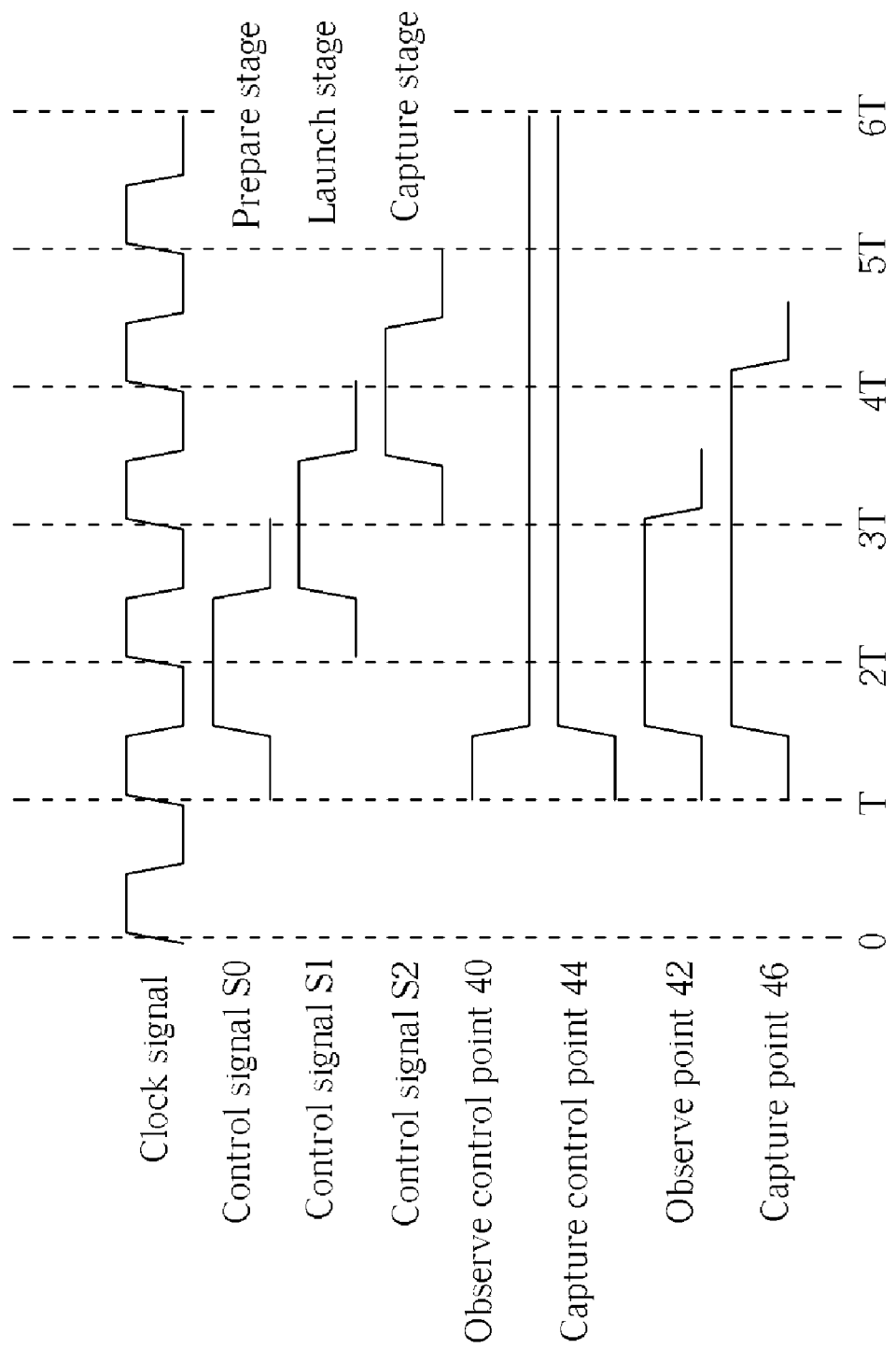
FIG. 5 illustrates a waveform diagram corresponding to the circuit in FIG. 4.

For example, please refer to FIG. 4 and FIG. 5. FIG. 4 illustrates a schematic diagram of a circuit when performing a test in accordance with the process 30, and FIG. 5 illustrates a waveform diagram corresponding to the circuit in FIG. 4. In FIG. 4, a controller 50 outputs control signals S0, S1, and S2 for the test according a clock signal CK, and transmits test results to a virtual instrumentation software architecture wrapper. An observe control point 40, an observe point 42, a capture control point 44, and a capture point 46, noted in FIG. 4, are outputs of D flip-flops 52, 54, 56, and 58. If length of a cycle of the clock signal CK is T, and if the controller 50 outputs a one-cycle-length control signal S0 at time point 1.5T, then the test enters the prepare stage. As a result, D flip-flop 52 is in a clear state, meaning that an output signal of the D flip-flop 52 is fixed to logic 0, and the D flip-flops 54, 56, and 58 are in set states, meaning that output signals of the D flip-flops 54, 56, and 58 are fixed to logic 1. So, the output signal of D flip-flop 52 is used to perform an OR operation with other fan-out signals in the circuit. Therefore, an input signal of a D end in the D flip-flop 54 is logic 0, but owing to the clear state, the output signal of the D flip-flop 54 is still logic 1. At time point 2.5T, the controller 50 outputs the one-cycle-length control signal S1, and the test enters the launch stage. Then, the control signal S1 used to perform an OR operation with the clock signal CK, so as to enable the D flip-flop 54 at time point 3T. As a result, the signal at the observe point 42 changes to logic 0 at time point 3T, so as to start "launching". At time point 3.5T, the controller 50 outputs the one-cycle-length control signal S2, then the test enters the capture stage. The control signal S2 is used to perform an OR operation with the clock signal CK, and the result is transmitted to the D flip-flop 58, so as to enable the D flip-flop 58 at time point 4T to change the signal at the capture point 46 from logic 1 to logic 0. Then, the output signals of the D flip-flop 58 are compared with an expected value, and all the comparison results are transmitted to the controller 50 finally.

In short, the present invention sets or resets the D flip-flops in a test path at different times, so the test is free from the timing signal. Furthermore, the present invention can achieve a built-in and at-speed self-test including tests of critical paths in a SOC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing a built-in and at-speed test in a system-on-chip comprising following steps:
    (a) receiving a statistic timing analysis report of the system-on-chip;
    (b) determining a plurality of critical paths for an at-speed test in the system-on-chip according to the statistic timing analysis report;
    (c) analyzing signals at observe control points and capture control points of each of the critical paths for generating a plurality of test states; and
    (d) transmitting the test states to a virtual instrumentation software architecture wrapper.

2. The method of claim 1, wherein step (a) further comprises:
    describing circuits of the system-on-chip according to a timing diagram comprising circuit nodes and weighted edges for receiving the statistic timing analysis report of the system-on-chip.

3. The method of claim 1, wherein step (c) further comprises:
    starting a prepare stage at a first time point for indicating a beginning of the at-speed test, starting a launch stage at a second time point for outputting test signals, and starting a capture stage at a third time point for receiving the test signals.

4. The method of claim 3, wherein the first time point is advanced to the second time point, and the second time point is advanced to the third time point.

5. The method of claim 1, wherein the virtual instrumentation software architecture further comprises a test access port controller.

6. The method of claim 5, wherein step (d) further comprises:
    transmitting the test states to the virtual instrumentation software architecture wrapper through the test access port controller.

7. A method for performing a built-in and at-speed test in a system-on-chip comprising following steps:
    (a) determining a plurality of critical paths for an at-speed test in the system-on-chip;
    (b) determining observe control points and capture control points of each of the critical paths; and
    (c) analyzing the system-on-chip according to signals of the observe control points and the capture control points.

8. The method of claim 7, wherein the critical paths are determined according to a statistic timing analysis report of the system-on-chip in step (a).

9. The method of claim 7, wherein step (c) further comprises:
    starting a prepare stage at a first time point for indicating a beginning of the at-speed test, starting a launch stage at a second time point for outputting test signals, and starting a capture stage at a third time point for receiving the test signals.

10. The method of claim 9, wherein the first time point is advanced to the second time point, and the second time point is advanced to the third time point.

11. The method of claim 7 further comprising step (d):
    transmitting test states generated in step (c) to a virtual instrumentation software architecture wrapper.

12. The method of claim 11, wherein the virtual instrumentation software architecture further comprises a test access port controller.

13. The method of claim 12, wherein step (d) further comprises:
    transmitting the test states to the virtual instrumentation software architecture wrapper through the test access port controller.

* * * * *